United States Patent
Hwang et al.

(10) Patent No.: US 11,451,007 B2
(45) Date of Patent: Sep. 20, 2022

(54) DRIVING CIRCUIT AND AN OPTICAL TRANSMITTER INCLUDING THE SAME

(71) Applicants: SK hynix Inc., Icheon-si Gyeonggi-do (KR); Seoul National University R&DB Foundation, Seoul (KR)

(72) Inventors: Jeongho Hwang, Seoul (KR); Hong Seok Choi, Seoul (KR); Hyungrok Do, Seoul (KR); Deog-Kyoon Jeong, Seoul (KR)

(73) Assignees: SK hynix Inc., Icheon-si (KR); Seoul National University R&DB Foundation, Seoul (KR)

( * ) Notice: Subject to any disclaimer, the term of this patent is extended or adjusted under 35 U.S.C. 154(b) by 287 days.

(21) Appl. No.: 16/709,669

(22) Filed: Dec. 10, 2019

(65) Prior Publication Data
US 2020/0335937 A1    Oct. 22, 2020

(30) Foreign Application Priority Data
Apr. 16, 2019   (KR) ......................... 10-2019-0044193

(51) Int. Cl.
*H01S 5/042* (2006.01)
*H03K 17/687* (2006.01)
*H01S 5/00* (2006.01)
*H01S 5/183* (2006.01)

(52) U.S. Cl.
CPC .............. *H01S 5/042* (2013.01); *H01S 5/00* (2013.01); *H03K 17/6872* (2013.01); *H01S 5/0014* (2013.01); *H01S 5/183* (2013.01)

(58) Field of Classification Search
CPC ......... H01S 5/00; H01S 5/06233; H01S 5/042
USPC ............................................ 372/38.01, 38.02
See application file for complete search history.

(56) References Cited

U.S. PATENT DOCUMENTS

| | | | |
|---|---|---|---|
| 4,758,941 A * | 7/1988 | Felton | H03K 17/691 363/17 |
| 7,233,165 B2 * | 6/2007 | Jordy | H04L 25/0286 326/29 |
| 7,764,122 B1 * | 7/2010 | Dasgupta | H03F 3/45475 330/264 |
| 8,660,158 B2 | 2/2014 | Miyajima et al. | |
| 9,231,573 B2 * | 1/2016 | Kinder | H03K 5/159 |
| 10,491,428 B2 * | 11/2019 | Parker | H04L 25/0298 |

(Continued)

FOREIGN PATENT DOCUMENTS

KR   100772994 B1   11/2007

OTHER PUBLICATIONS

Abhinav Tyagi et al., A 50 Gb/s PAM-4 VCSEL Transmitter With 2.5-Tap Nonlinear Equalization in 65-nm CMOS, Jul. 1, 2018, pp. 1246-1249, IEEE Photonics Technology Letters, vol. 30, No. 13.

(Continued)

*Primary Examiner* — Tuan N Nguyen
(74) *Attorney, Agent, or Firm* — William Park & Associates Ltd.

(57) ABSTRACT

A driving circuit includes an input circuit slice configured to convert a data signal into a first data signal and a second data signal having different DC components. The driving circuit also includes a driver slice configured to output driving current at an output node by generating push current or pull current according to the first data signal and the second data signal, wherein a magnitude of the push current or the pull current is variable.

18 Claims, 4 Drawing Sheets

(56) References Cited

U.S. PATENT DOCUMENTS

| | | | | |
|---|---|---|---|---|
| 2012/0294324 | A1* | 11/2012 | Miyajima | H01S 5/0428 372/38.02 |
| 2015/0288144 | A1* | 10/2015 | Raj | H01S 3/1305 372/21 |

OTHER PUBLICATIONS

Alireza Sharif-Bakhtiar et al., A 40-Gbps 0.5-pJ/bit VCSEL Driver in 28nm CMOS with Complex Zero Equalizer, 2017 IEEE.

Jihwan Kim et al., A 112Gb/s PAM-4 Transmitter with 3-Tap FFE in 10nm CMOS, Feb. 12, 2018 / 1:30 PM, ISSCC 2018 / Session 6 / Ultra-High-Speed Wireline / 6.1, 2018 IEEE International Solid-State Circuits Conference, Intel, Hillsboro, OR.

John D'Ambrosia, IEEE P802.3bs Baseline Summary, IEEE P802.3bs 400 GbE Task Force, Jul. 18, 2015.

Jonathan E. Proesel et al., A 32 Gb/s, 4.7 pJ/bit Optical Link With -11.7 dBm Sensitivity in 14-nm FinFET CMOS, Apr. 2018, pp. 1214-1226, IEEE Journal of Solid-State Circuits, vol. 53, No. 4.

Mohammad Mahdi Khafaji et al., A 4×45 Gb/s Two-Tap FFE VCSEL Driver in 14-nm FinFET CMOS Suitable for Burst Mode Operation, pp. 1-10, IEEE Journal of Solid-State Circuits.

Ping-Chuan Chiang et al., "4×25 Gb/s transceiver with optical front-end for 100GbE system in 65 nm CMOS technology," IEEE J.Solid-State Circuits, vol. 50, No. 2, pp. 573-585, Feb. 2015.

Takayuki Shibasaki et al., "4×25.78Gb/s retimer ICs for optical links in 0.13µm SiGe BiCMOS," in IEEE Int. Solid-Sate Circuits Conf. (ISSCC) Dig.Tech. Papers, Feb. 2015, pp. 412-413.

Weiss, Jonas Rudolf Michael, Nanometer-Scale CMOS Circuits and Packaging for Electro-Optical High Density Interconnects up to 40 Gb/s, pp. 1-240, 2008, ETH Zürich, ETH Library Research Collection.

Woorham Bae et al., A 6-to-32 Gb/s Voltage-Mode Transmitter with Scalable Supply, Voltage Swing, and Pre-Emphasis in 65-nm CMOS, Nov. 7-9, 2016, pp. 241-244, IEEE Asian Solid-State Circuits Conference, Toyama, Japan.

Xuquiang Zheng et al., A 40-Gb/s Quarter-Rate SerDes Transmitter and Receiver Chipset in 65-nm CMOS, Nov. 2017, pp. 2963-2978, IEEE Journal of Solid-State Circuits, vol. 52, No. 11.

Jeongho Hwang et al., A 32 GB/s, 201 mW, MZM/EAM Cascode Push-Pull CML Driver in 65 nm CMOS, IEEE Transactions on Circuits and Systems II: Express Briefs (vol. 65, Issue: 4, Apr. 2018), pp. 436-440.

Mayank Raj et al., A Modelling and Nonlinear Equalization Technique for a 20 GB/s 0.77 pJ/b VCSEL Transmitter in 32 nm SOI CMOS, IEEE Journal of Solid-State Circuits, vol. 51, No. 8, Jul. 2016, pp. 1734-1743.

* cited by examiner

DRIVING CIRCUIT AND AN OPTICAL TRANSMITTER INCLUDING THE SAME

CROSS-REFERENCE TO RELATED APPLICATION

The present application claims priority under 35 U.S.C. § 119(a) to Korean Patent Application No. 10-2019-0044193, filed on Apr. 16, 2019, which is incorporated herein by reference in its entirety.

BACKGROUND

1. Technical Field

Various embodiments may relate to a driving circuit and an optical transmitter including the driving circuit, and more particularly, to a driving circuit for driving an optical device with high voltage to transmit data and an optical transmitter including the driving circuit.

2. Related Art

As the amount of data to be transmitted increases, high-speed transmission circuits are being developed, and a technique for transmitting multi-bit data is being developed.

In order to transmit multi-bit data, signal-to-noise ratio (SNR) performance should be excellent, which requires additional power consumption.

In order to solve such a problem, an optical communication technique for transmitting and receiving data using an optical fiber can be used.

For example, data and clock signals can be received at a semiconductor circuit, serialized at a rate to transmit them, and then converted into optical signals through an optical device.

Recently, a Vertical Cavity Surface Emitting Laser (VCSEL) device has been widely used as an optical device. The VCSEL device must be driven at a relatively high voltage initially.

There is a problem in that the reliability or stability of the circuit deteriorates when the driving circuit operates at high voltage and at high speed.

SUMMARY

In accordance with an embodiment of the present disclosure, a driving circuit may include an input circuit slice configured to convert a data signal into a first data signal and a second data signal having different DC components. The driving circuit further includes a driver slice configured to output driving current at an output node by generating push current or pull current according to the first data signal and the second data signal, wherein magnitude of the push current or magnitude of the pull current is variable.

In accordance with an embodiment of the present disclosure, an optical transmitter may include an optical device and a driving circuit configured to drive the optical device. The driving circuit includes an input circuit slice configured to convert a data signal into a first data signal and a second data signal having different DC components and a driver slice configured to output driving current at an output node by generating push current or pull current according to the first data signal and the second data signal, wherein magnitude of the push current or the pull current is variable.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

Various embodiments of the present teachings are described below with reference to the accompanying figures. Embodiments are provided for illustrative purposes and other embodiments that are not explicitly illustrated or described are possible. Further, modifications can be made to embodiments of the present disclosure that are described in detail below.

Figure 1:
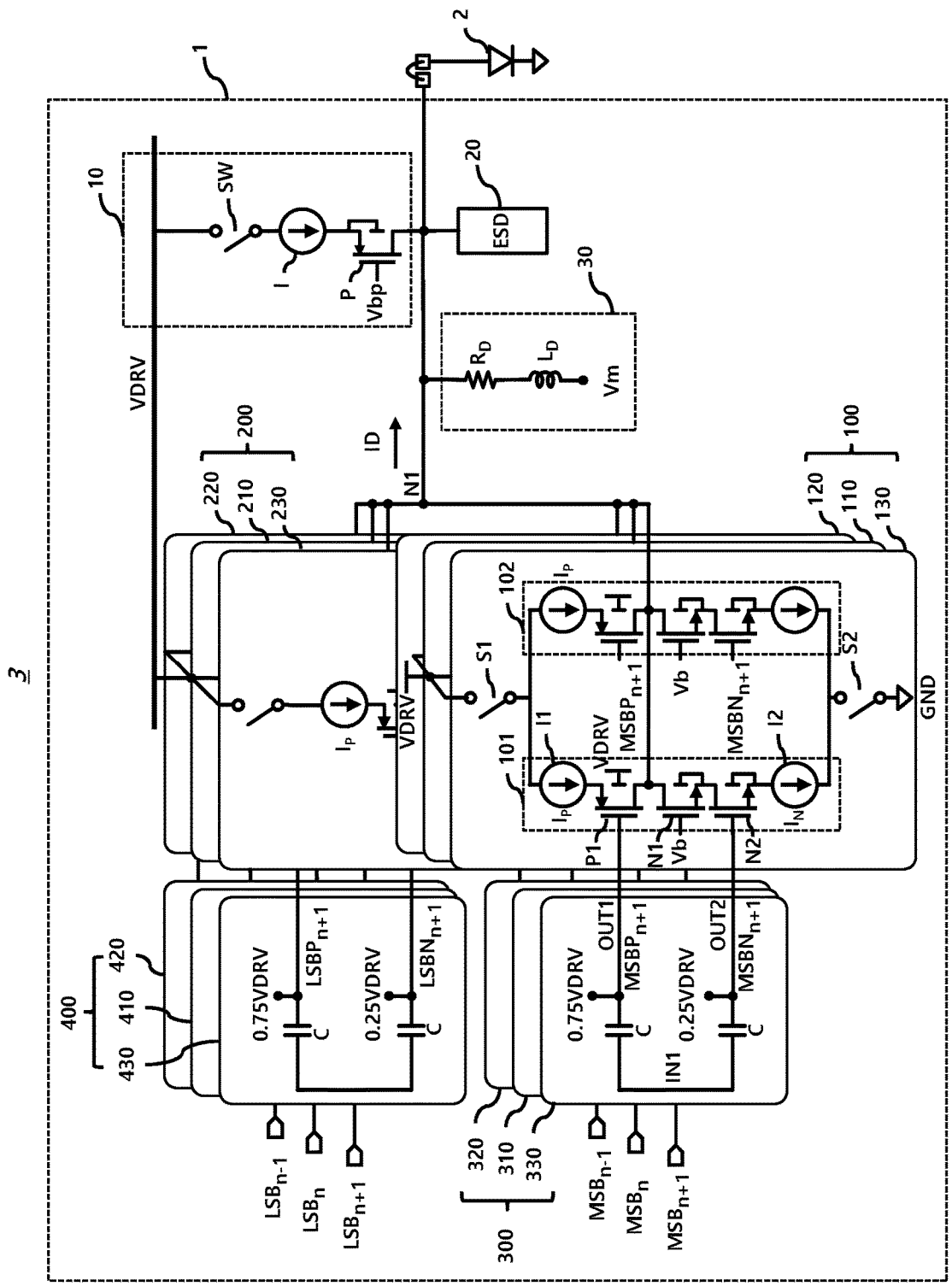
FIG. 1 illustrates an optical transmitter according to an embodiment.

FIG. 1 illustrates an optical transmitter 3 according to an embodiment of the present disclosure.

The optical transmitter 3 is shown to include a driving circuit 1 and an optical device 2.

In the present embodiment, the optical device 2 is a Vertical Cavity Surface Emitting Laser (VCSEL) device.

In this embodiment, the VCSEL device requires a high voltage of 1.8 V at the turn-on time, and uses 3.3 V as a power supply voltage VDRV to drive the device.

Accordingly, in this embodiment, the driving circuit 1 has a structure for withstanding a large swing and a high power supply voltage.

In this embodiment, the driving circuit 1 transmits multi-bit data, and the multi-bit includes an upper bit signal MSB and a lower bit signal LSB.

The driving circuit 1 includes a first driver 100 for generating a driving signal corresponding to the upper bit signal MSB, a second driver 200 for generating a driving signal corresponding to the lower bit signal LSB, a first input circuit 300 for controlling the first driver 100 according to an upper bit signal MSB, and a second input circuit 400 for controlling the second driver 200 according to a lower bit signal LSB.

In the present embodiment, the driving signal may be a current signal, and therefore, a driving current may be used to designate the driving signal in the following description.

The driving circuit 1 basically operates according to the current values MSBn and LSBn of the upper bit signal MSB and the lower bit signal LSB and selectively outputs past values MSBn−1 and LSBn−1 or future values MSBn+1 and LSBn+1 of the upper bit signal MSB and the lower bit signal LSB.

Accordingly, the first driver 100 includes an 11th driver 110, a 12th driver 120, and a 13th driver 130. The 11th driver 110 generates driving current corresponding to current value MSBn of the upper bit signal MSB, the 12th driver 120 generates driving current corresponding to past value MSBn−1 of the upper bit signal MSB, and the 13th driver 130 generates driving current corresponding to future value MSBn+1 of the upper bit signal MSB.

Each of the 11th driver 110, the 12th driver 120, and the 13th driver 130 may be referred to as a first driver slice, and the 12th driver 120 and the 13th driver 130 may be selectively used.

Each of the first driver slices has substantially the same structure, but the magnitude of the driving current provided in each first driver slice may be different.

The detailed structure of the first driver slice is described with reference to the 13th driver 130.

The first driver slice includes a first switch S1 and a second switch S2 connected between a power supply VDRV and a ground GND.

Two current driving circuits 101 and 102 are connected in parallel between the first switch S1 and the second switch S2.

The two current driving circuits 101 and 102 have substantially the same structure.

The current driving circuit 101 includes a first current source I1, a first PMOS transistor P1, a first NMOS transistor N1, a second NMOS transistor N2, and a second current source I2, which are serially connected between the first switch S1 and the second switch S2.

The first current source I1 provides the first current $I_P$ and the second current source I2 provides the second current $I_N$.

The first current $I_P$ and the second current $I_N$ provide a driving current in the PUSH operation and the PULL operation, respectively, and the size thereof can be variably adjusted.

The first upper bit signal MSBP is applied to the gate of the first PMOS transistor P1 and the second upper bit signal MSBN is applied to the gate of the second NMOS transistor N2.

The first upper bit signal MSBP and the second upper bit signal MSBN are signals obtained by converting the upper bit signal MSB into differential form in the first input circuit 300.

A bias voltage Vb is applied to the gate of the first NMOS transistor N1.

The power source voltage VDRV is applied to the back gate of the first PMOS transistor P1, and the back gate of the first NMOS transistor N1 and the second NMOS transistor N2 are connected to the respective sources.

The drains of the first PMOS transistor P1 and the first NMOS transistor N1 are commonly connected to the output node N1.

The source of the first NMOS transistor N1 and the drain of the second NMOS transistor N2 are connected in common.

In this embodiment, the first NMOS transistor N1 and the second NMOS transistor N2 are deep N-well (DNW) elements.

Generally, the DNW device can reduce noise by isolating the NMOS transistor. In this embodiment, the DNW structure can reduce the stress of the NMOS transistor during a high voltage operation.

Figure 2:
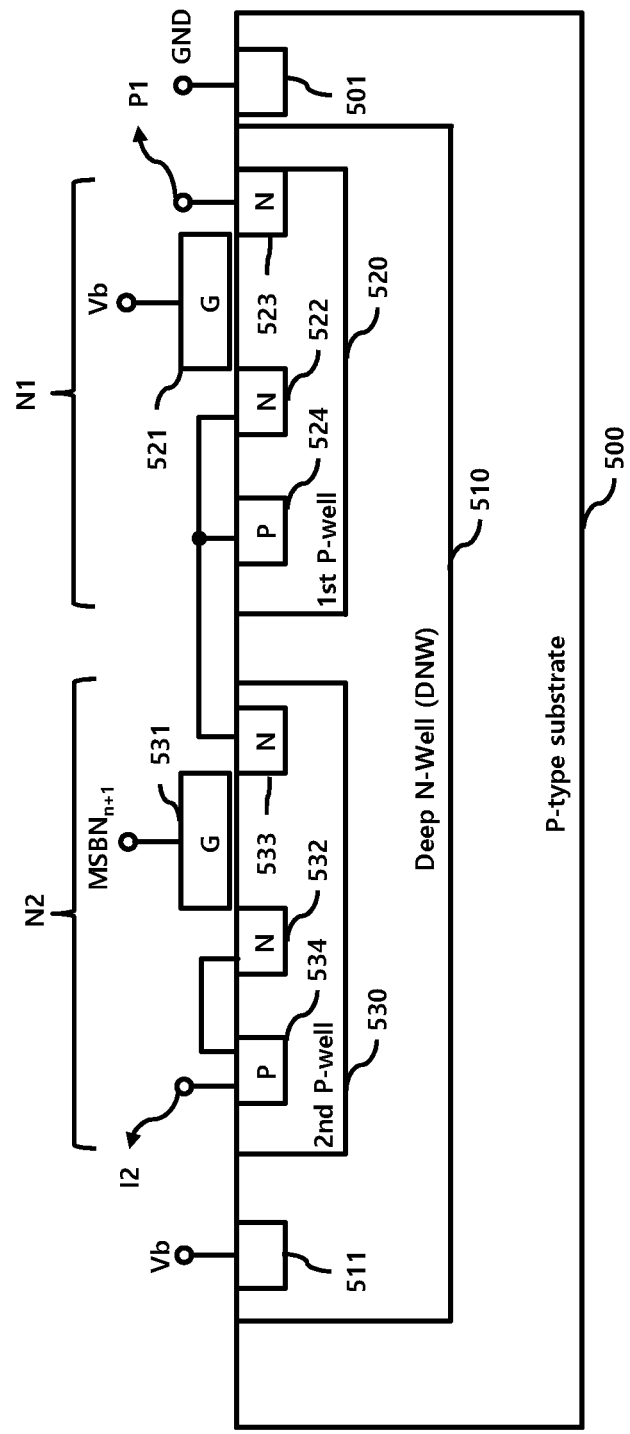
FIG. 2 illustrates a structure of a deep N-well region according to an embodiment.

FIG. 2 is a cross-sectional view showing the structure of the DNW region.

The DNW region 510 is formed on the P-type substrate 500 and the first NMOS transistor N1 and the second NMOS transistor N2 are formed on the DNW region 510.

The P-type substrate 500 is grounded through a contact 501 and bias voltage Vb is applied to the DNW region 510 through the contact 511.

First, the structure of the first NMOS transistor N1 is described.

A first P-well 520 is formed in the DNW region 510 to form a first NMOS transistor N1. And a source 522 and a drain 523 are formed in the first P-well 520. A gate 521 is formed on an upper portion of a region between the source 522 and the drain 523.

A first contact 524 is formed in the first P-well 520 through P-type doping, and the first contact 524 is coupled in common with the source 522.

The drain 523 is coupled to the first PMOS transistor P1 and the gate 521 is coupled to a bias voltage Vb.

Next, the structure of the second NMOS transistor N2 will be described.

A second P-well 530 spaced apart from the first P-well 520 is formed in the DNW region 510 to form a second NMOS transistor N2. A source 532 and a drain 533 are formed in the second P-well. And a gate 531 is formed on an upper portion of the region between the source 532 and the drain 533.

A second contact 534 is formed through P-type doping in the second P-well 530, and the second contact 534 is coupled in common with the source 532.

The drain 533 is coupled to the drain 522 of the first NMOS transistor N1 in common and the source 532 is coupled to the second current source I2 and the gate 531 is coupled to the second upper bit signal MSBNn+1.

By fixing voltage of the DNW region 510 to the bias voltage Vb, the voltage at the interface between the first P-well 520 and the second P-well 530 is reduced as compared with the case where the DNW region 510 is not present, which reduce stress by a high voltage operation.

Referring back to FIG. 1, the first switch S1 and the second switch S2 may control whether the corresponding first driver slice is used and the magnitude of the driving current provided to the first driver slice.

For example, the first switch S1 may be implemented as a PMOS transistor and may control the magnitude of the driving current by regulating a signal applied to its gate.

At this time, a gate signal corresponding to a control signal may be applied to control the first switch S1. A level of the control signal may be adjusted to be between 2.5V and 3.3V to be provided as the gate signal for the PMOS transistor.

The second switch S2 may be implemented by an NMOS transistor and may control the magnitude of the driving current by adjusting the signal applied to the gate thereof.

At this time, a gate signal corresponding to a control signal may be applied to the second switch S2. The level of the control signal may be adjusted to be between 0V and 1V to be provided as the gate signal for the NMOS transistor.

As described above, the 13th driver 130 includes two parallel-connected current driving circuits. In this embodiment, the 11th driver 110 includes four parallel-connected current driving circuits and the 12th driver 120 includes two parallel-connected current driving circuits.

The second driver 200 includes a 21st driver 210, a 22nd driver 220, and a 23rd driver 230. The 21st driver 210 generates driving current corresponding to current value LSBn of the lower bit signal LSB, the 22nd driver 220 generates driving current corresponding to past value LSBn−1 of the lower bit signal LSB, and the 23rd driver 220 generates driving current corresponding to future value LSBn+1 of the lower bit signal LSB.

Each of the 21st driver 210, the 22nd driver 220, and the 23rd driver 230 may be referred to as a second driver slice. The 22nd driver 220 and the 23rd driver 230 may be selectively used.

Each of the second driver slices has substantially the same structure, but the magnitude of the driving current can be adjusted differently. Each of the first driver slices or each of the second driver slices may be designated as a driver slice.

In the embodiment, the 23rd driver 230 includes one current driving circuit, the 21st driver 210 includes two parallel-connected current driving circuits, and the 22nd driver 220 includes one current driving circuit.

Except for the number of current driving circuits, the second driver slice has substantially the same structure as the first driver slice, thus a detailed description is not repeated here.

The first input circuit 300 converts the upper bit signal MSB into a first upper bit signal MSBP and a second upper bit signal MSBN.

The first input circuit 300 includes an 11th input circuit 310, a 12th input circuit 320, and a 13th input circuit 330. The 11th input circuit 310 corresponds to current value MSBn of the upper bit signal MSB, the 12th input circuit 320 corresponds to past value MSBn−1 of the upper bit signal MSB, and the 13th input circuit 330 corresponds to future value MSBn+1 of the upper bit signal MSB. Each of the 11th input circuit 310, the 12th input circuit 320, and the 13th input circuit 330 may be referred to as a first input circuit slice.

In FIG. 1, the 13th input circuit 330 is shown, and the 11th input circuit 310 and the 12th input circuits 320 have substantially the same structure.

The first input circuit slice includes an input node IN1 to which the upper bit signal MSB is input, a first output node OUT1 to which the first upper bit signal MSBP is output, and a second output node OUT2 to which a second upper bit signal MSBN is output.

The first output node OUT1 and the second output node OUT2 are connected to the input node IN1 through a coupling capacitor C, respectively.

The first output node OUT1 is biased at 0.75 times the power supply voltage VDRV and the second output node OUT2 is biased at 0.25 times the power supply voltage VDRV in this embodiment.

Although the configuration for providing the bias voltage is not specifically shown, for example, the bias voltage can be provided by dividing the power supply voltage VDRV with resistors connected in series.

Figure 3:
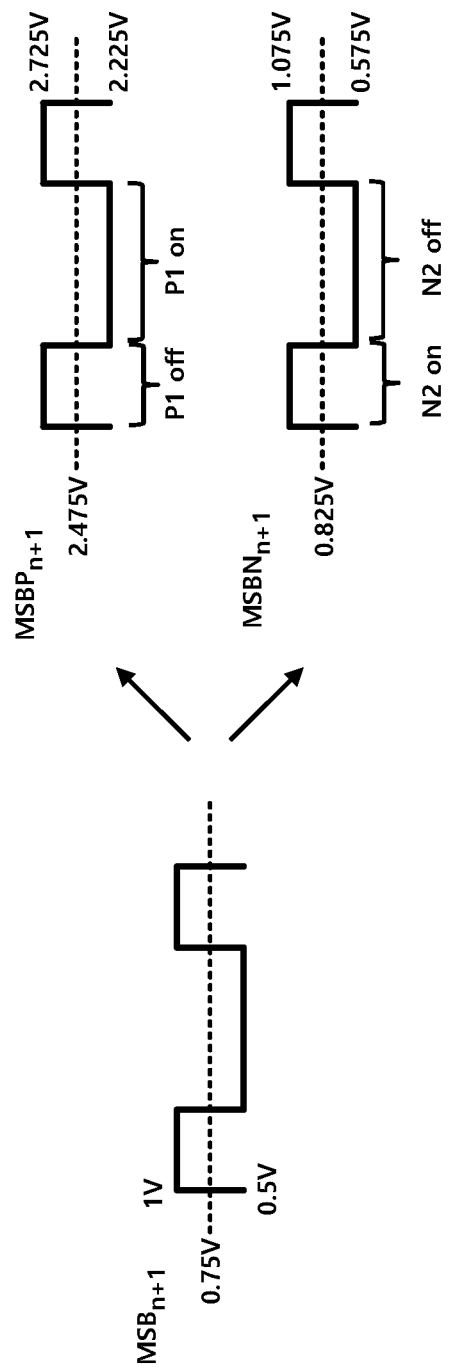
FIG. 3 illustrates an operation of a first input circuit according to other embodiment.

Referring FIG. 3, the operation of the first input circuit 300 is described taking the 13th input circuit 330 as an example.

For example, assume that the upper bit signal MSBn+1 has a level between 0.5V and 1V and is divided into a high level or a low level based on 0.75V.

At this time, the first upper bit signal MSBPn+1 has a level between 2.225V and 2.725V and is divided into a high level or a low level based on 2.475V.

The second higher bit signal MSBNn+1 has a level between 0.575 and 1.075V and is divided into a high level or a low level based on 0.825V.

When the first upper bit signal MSBPn+1 is at a high level, the first PMOS transistor P1 is turned off. When the first upper bit signal MSBPn+1 is at a low level, the first PMOS transistor P1 is turned on to perform a push operation.

When the second upper bit signal MSBNn+1 is at a high level, the second NMOS transistor N2 is turned on to perform the pull operation, and when the second upper bit signal MSBNn+1 is at a low level, the second NMOS transistor N2 is turned off.

The second input circuit 400 converts the lower bit signal LSB into a first lower bit signal LSBP and a second lower bit signal LSBN.

The second input circuit 400 includes an 21st input circuit 410, a 22nd input circuit 420, and a 23rd input circuit 430. The 21st input circuit 410 corresponds to current value LSBn of the lower bit signal LSB, the 22nd input circuit 420 corresponds to past value LSBn−1 of the lower bit signal LSB, and the 23rd input circuit 430 corresponds to future value LSBn+1 of the lower bit signal LSB. Each of the 21st input circuit 410, the 22nd input circuit 420, and the 23rd input circuit 430 may be referred to as a second input circuit slice. A first input circuit slice or a second input slice may be designated as an input circuit slice.

In FIG. 1, an example of the 23rd input circuit 430 is shown, and the 21st and 22nd input circuits 410 and 420 have substantially the same structure.

Because the second input circuit slice has substantially the same configuration as the first input circuit slice, a detailed description is not repeated here.

In this embodiment, the first driver slice and the second driver slice have a structure in which a total of seven transistors are connected between the power supply voltage VDRV and the ground GND.

Accordingly, even if the power source voltage VDRV increases, the voltage applied to each transistor can be sufficiently reduced, thereby relieving or mitigating voltage stress and improving component lifetimes.

In this embodiment, the operation of each of the first driver slice and the second driver slice, and current flowing through each driver slice can be controlled in various ways. Moreover, current during a push operation and current during a pull operation can be controlled differently in each slice.

Accordingly, the rising and falling timing of the driving signal can be adjusted and the pre-emphasis operation can be performed together to reduce inter-symbol interference (ISI) between symbols.

This makes it possible to overcome the nonlinearity of the VCSEL device used as the optical device 2.

For example, the frequency range and average current at which a VCSEL device operates can be determined during a design stage and an optimum driving current condition can be selected to reduce the nonlinearity of the VCSEL device under those conditions.

Number of the first driver slices and the second driver slices being used, and value of the push current and value of the pull current in each driver slice can be selected from the driving current condition.

In this embodiment, the driving circuit 1 may further include a current driving circuit 10, also referred to as a bias current providing circuit.

The current driving circuit 10 provides a direct current (DC) bias current in the turn-on state of the VCSEL device 2.

The current driving circuit 10 of the present embodiment includes a switch SW, a current source I, and a PMOS transistor P to which the bias voltage Vbp is applied being connected in series between the power supply VDRV and the output node N1.

In this embodiment, the driving circuit 1 may further include an electrostatic discharge (ESD) protection circuit 20 for performing an electrostatic protection operation.

In this embodiment, the driving circuit 1 may further include a bandwidth widening circuit 30.

The bandwidth widening circuit 30 includes a resistor $R_D$ and an inductor $L_D$ connected in series. The output node N1 is connected to one end of the resistor $R_D$ and an intermediate voltage Vm is applied to one end of the inductor $L_D$.

In the present embodiment, the magnitude of the intermediate voltage Vm is selected to be 2.5V, which is larger than the turn-on voltage 1.8 V of the VCSEL device 2.

The bandwidth widening circuit 30 serves to improve the bandwidth of the signal at the output node N1 by the shunt peaking phenomenon.

Figure 4:
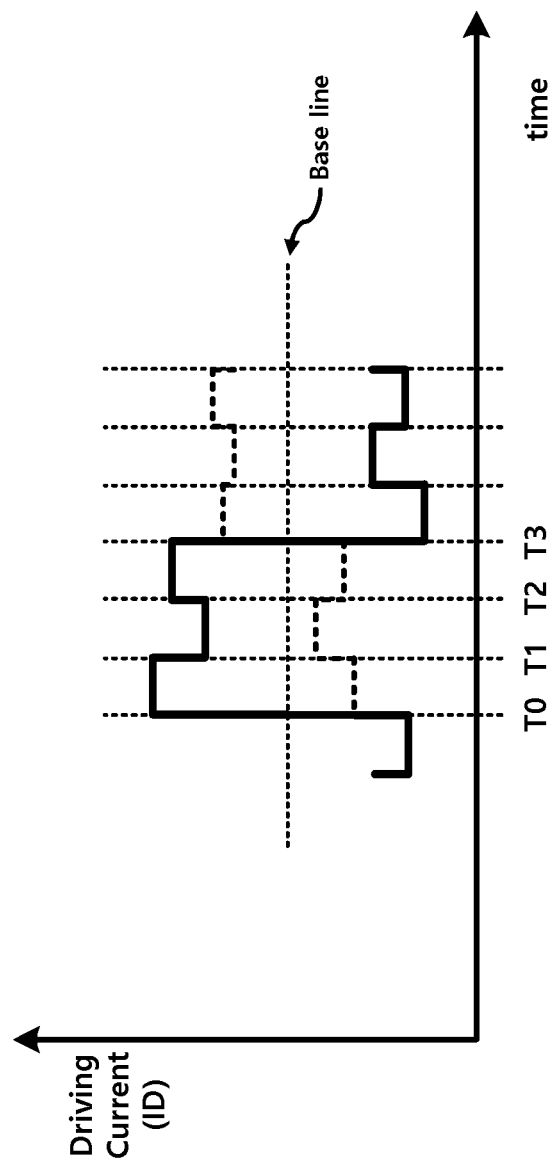
FIG. 4 illustrates a driving current according to an embodiment.

FIG. 4 is a graph showing an example of a driving current ID.

In FIG. 4, a solid line indicates a driving current according to the upper bit signal MSB and a dotted line indicates a driving current according to the lower bit signal LSB.

The driving current in a direction output from the output node N1 corresponds to the upper portion of the base line. In this case, it can be seen that the first driver 100 or the second driver 200 has performed a push operation as a whole.

The driving current in a direction flowing into the output node N1 corresponds to the lower portion of the base line. In this case, it can be seen that the first driver 100 or the second driver 200 has performed a pull operation as a whole.

In this embodiment, a method of adjusting the driving current is described by taking the operation of the first driver 100 as an example.

The time interval from T0 to T3 is divided into three sections, and the magnitude of driving current varies according to section.

The 11th driver 110 operates to generate push current and the 12th driver 120 performs a pull operation to reduce the push current by the 11th driver 110 between times T0 and T1 where the driving current is maximum.

The 11th driver 110 performs push operation while the 12th and 13th drivers 120 and 130 perform a pull operation to reduce the magnitude of the push current by the 11th driver 110 between times T1 and T2 where the driving current is minimum.

The 11th driver 110 performs push operation while the 13th drivers 130 performs a pull operation to reduce the magnitude of the push current by the 11th driver 110 between times T2 and T3 where the driving current is intermediate.

In this manner, the 11th driver 110 operates in accordance with the upper bit signal MSB, while operations of the 12th and 13th drivers 120 and 130 can be selectively changed, thereby varying the magnitude of the overall driving current. The magnitude of the current in each time section can be variously adjusted according to the embodiment.

Although various embodiments have been described for illustrative purposes, various changes and modifications may be possible.

What is claimed is:

1. A driving circuit comprising:
    an input circuit slice configured to convert a data signal into a first data signal and a second data signal having different direct current (DC) levels; and
    a driver slice configured to output driving current at an output node by generating push current or pull current according to the first data signal level and the second data signal level;
    wherein a magnitude of the push current or the pull current is variable,
wherein the input circuit slice is configured to convert a present value of the data signal into the first data signal and the second data signal,
    wherein the driving circuit further comprises:
    another input circuit slice configured to convert one of a past value or a future value of the data signal into another first data signal and another second data signal having different DC levels; and
    another driver slice configured to output driving current at the output node by generating push current or pull current according to the another first data signal level and the another second data signal level, and
    wherein magnitude of the push current or magnitude of the pull current by the another driver slice is variable.

2. The driving circuit of claim 1, wherein the driver slice comprises one or more current driving circuits each comprising:
    a first current source;
    a first PMOS transistor having a gate receiving the first data signal, a source coupled to the first current source, and a drain coupled to the output node;
    a first NMOS transistor having a gate receiving a bias voltage and a drain coupled to the output node;
    a second NMOS transistor having a gate receiving the second data signal and a drain coupled to a source of the first NMOS transistor; and
    a second current source coupled to a source of the second NMOS transistor.

3. The driving circuit of claim 2, wherein the first NMOS transistor is formed in a first P-well and the second NMOS transistor is formed in a second P-well, wherein the first P-well and the second P-well are spaced apart from each other in a deep N-well region, wherein the deep N-well region is formed in a P-type substrate.

4. The driving circuit of claim 2, wherein the driver slice further comprises:
    a first switch configured to provide a power supply voltage to the first current source; and
    a second switch configured to provide a ground voltage to the second current source,
    wherein each of the first switch and the second switch is controlled by a control signal.

5. The driving circuit of claim 4, wherein each of the first switch and the second switch is controlled so that a magnitude of current is adjusted according to a magnitude of the control signal.

6. The driving circuit of claim 1, further comprising:
    a bandwidth widening circuit coupled between the output node and an intermediate voltage,
    wherein the intermediate voltage is less than a power supply voltage and is greater than a turn-on voltage of an optical device receiving the driving current.

7. The driving circuit of claim 6, further comprising:
    a bias current providing circuit coupled between the output node and the power supply voltage,
    wherein the bias current providing circuit provides a bias current to the optical device when the optical device is turned on.

8. The driving circuit of claim 1, further comprising:
    an electrostatic discharge protection circuit coupled to the output node.

9. A driving circuit comprising:
    an input circuit slice configured to convert a data signal into a first data signal and a second data signal having different direct current (DC) levels; and
    a driver slice configured to output driving current at an output node by generating push current or pull current according to the first data signal level and the second data signal level;
    wherein a magnitude of the push current or the pull current is variable,
    wherein the data signal is a multi-bit signal,
    wherein the input circuit slice configured to convert a bit of the data signal into the first data signal and the second data signal, wherein the driving circuit further comprises:
another input circuit slice configured to convert another bit of the data signal into another first data signal and another second data signal having different DC levels; and
another driver slice configured to output driving current at the output node by generating push current or pull current according to the another first data signal level and the another second data signal level, and
wherein a magnitude of the push current or the pull current by the another driver slice is variable.

10. An optical transmitter comprising:
an optical device; and
a driving circuit configured to drive the optical device,
wherein the driving circuit includes:
an input circuit slice configured to convert a data signal into a first data signal and a second data signal having different direct current (DC) levels; and
a driver slice configured to output driving current at an output node by generating push current or pull current according to the first data signal level and the second data signal level,
wherein a magnitude of the push current or the pull current is variable,
wherein the input circuit slice is configured to convert a present value of the data signal into the first data signal and the second data signal,
wherein the driving circuit further comprises:
another input circuit slice configured to convert one of a past value or a future value of the data signal into another first data signal and another second data signal having different DC levels; and
another driver slice configured to output driving current at the output node by generating push current or pull current according to the another first data signal level and the another second data signal level, and
wherein magnitude of the push current or magnitude of the pull current by the another driver slice is variable.

11. The optical transmitter of claim 10, wherein the driver slice comprises one or more current driving circuits each comprising:
a first current source;
a first PMOS transistor having a gate receiving the first data signal, a source coupled to the first current source, and a drain coupled to the output node;
a first NMOS transistor having a gate receiving a bias voltage and a drain coupled to the output node;
a second NMOS transistor having a gate receiving the second data signal and a drain coupled to a source of the first NMOS transistor; and
a second current source coupled to a source of the second NMOS transistor.

12. The optical transmitter of claim 11, wherein the first NMOS transistor is formed in a first P-well and the second NMOS transistor is formed in a second P-well, wherein the first P-well and the second P-well are spaced apart from each other in a deep N-well region, wherein the deep N-well region is formed in a P-type substrate.

13. The optical transmitter of claim 11, wherein the driver slice further comprises:
a first switch configured to provide a power supply voltage to the first current source; and
a second switch configured to provide a ground voltage to the second current source,
wherein each of the first switch and the second switch is controlled by a control signal.

14. The optical transmitter of claim 13, wherein each of the first switch and the second switch is controlled so that a magnitude of current is adjusted according to a magnitude of the control signal.

15. The optical transmitter of claim 10, further comprising:
a bandwidth widening circuit coupled between the output node and an intermediate voltage,
wherein the intermediate voltage is less than a power supply voltage and is greater than a turn-on voltage of the optical device.

16. The optical transmitter of claim 15, further comprising:
a bias current providing circuit coupled between the output node and the power supply voltage,
wherein the bias current providing circuit provides a bias current to the optical device when the optical device is turned on.

17. The optical transmitter of claim 10, further comprising:
an electrostatic discharge protection circuit coupled to the output node.

18. An optical transmitter comprising:
an optical device; and
a driving circuit configured to drive the optical device,
wherein the driving circuit includes:
an input circuit slice configured to convert a data signal into a first data signal and a second data signal having different direct current (DC) levels; and
a driver slice configured to output driving current at an output node by generating push current or pull current according to the first data signal level and the second data signal level,
wherein a magnitude of the push current or the pull current is variable,
wherein the data signal is a multi-bit signal,
wherein the input circuit slice configured to convert a bit of the data signal into the first data signal and the second data signal,
wherein the driving circuit further comprises:
another input circuit slice configured to convert another bit of the data signal into another first data signal and another second data signal having different DC levels; and
another driver slice configured to output driving current at the output node by generating push current or pull current according to the another first data signal level and the another second data signal level, and
wherein a magnitude of the push current or the pull current by the another driver slice is variable.

* * * * *